United States Patent
Kon

(10) Patent No.: US 9,912,851 B2
(45) Date of Patent: Mar. 6, 2018

(54) IMAGE-CAPTURING DEVICE, ORGANIC EL ELEMENT, IMAGE-CAPTURING METHOD, PROGRAM, AND RECORDING MEDIUM

(71) Applicant: NEC LIGHTING, LTD., Minato-ku, Tokyo (JP)

(72) Inventor: Shusaku Kon, Tokyo (JP)

(73) Assignee: NEC LIGHTING, LTD., Tokyo (JP)

( * ) Notice: Subject to any disclaimer, the term of this patent is extended or adjusted under 35 U.S.C. 154(b) by 0 days.

(21) Appl. No.: 15/032,499

(22) PCT Filed: Oct. 21, 2014

(86) PCT No.: PCT/JP2014/078002
§ 371 (c)(1),
(2) Date: Apr. 27, 2016

(87) PCT Pub. No.: WO2015/068568
PCT Pub. Date: May 14, 2015

(65) Prior Publication Data
US 2016/0255258 A1 Sep. 1, 2016

(30) Foreign Application Priority Data
Nov. 8, 2013 (JP) ................................. 2013-232165

(51) Int. Cl.
*H04N 5/225* (2006.01)
*H04N 5/238* (2006.01)
(Continued)

(52) U.S. Cl.
CPC .......... *H04N 5/2256* (2013.01); *H04N 5/238* (2013.01); *H04N 5/2354* (2013.01); *H04N 5/335* (2013.01); *H01L 2251/5323* (2013.01)

(58) Field of Classification Search
CPC ........................ H04N 5/2256; H04N 5/2354
See application file for complete search history.

(56) References Cited

U.S. PATENT DOCUMENTS

2006/0152487 A1* 7/2006 Grunnet-Jepsen .... G06F 3/0346
345/158
2007/0077105 A1* 4/2007 Sato .................. H01L 27/14601
399/411
(Continued)

FOREIGN PATENT DOCUMENTS

JP         S63-76564 A      4/1988
JP         H06-189078 A     7/1994
(Continued)

OTHER PUBLICATIONS

International Search Report for PCT Application No. PCT/JP2014/078002, dated Jan. 20, 2015.

*Primary Examiner* — Roberto Velez
*Assistant Examiner* — Cynthia Segura

(57) ABSTRACT

Provided is an image-capturing device that reduces the effect of direct incident light on an image-capturing element and allows a high contrast image to be obtained. An image-capturing device includes: an image-capturing element; a light emitting element; and an image data correction unit, wherein the light emitting element irradiates a subject with light, the image-capturing element senses the light reflected by the subject and generates an image data, and the image data correction unit corrects the image data by subtracting incident light directly entered into the image-capturing element from the light emitting element without being reflected by the subject from the image data.

9 Claims, 2 Drawing Sheets

(51) Int. Cl.
*H04N 5/235* (2006.01)
*H04N 5/335* (2011.01)

(56) References Cited

U.S. PATENT DOCUMENTS

| | | | |
|---|---|---|---|
| 2009/0079345 A1* | 3/2009 | Inuiya | H01L 27/3234 313/523 |
| 2009/0161051 A1 | 6/2009 | Fukunaga et al. | |
| 2009/0295960 A1* | 12/2009 | Inada | H01L 27/1446 348/294 |
| 2014/0028743 A1* | 1/2014 | Yamaguchi | G09G 5/02 345/697 |
| 2014/0183578 A1* | 7/2014 | Horie | F21K 9/00 257/89 |

FOREIGN PATENT DOCUMENTS

| | | |
|---|---|---|
| JP | 2003-087502 A | 3/2003 |
| JP | 2004-109430 A | 4/2004 |
| JP | 2008-227836 A | 9/2008 |
| JP | 2009-151039 A | 7/2009 |

\* cited by examiner

IMAGE-CAPTURING DEVICE, ORGANIC EL ELEMENT, IMAGE-CAPTURING METHOD, PROGRAM, AND RECORDING MEDIUM

This application is a National Stage Entry of PCT/JP2014/078002 filed on Oct. 21, 2014, which claims priority from Japanese Patent Application 2013-232165 filed on Nov. 8, 2013, the contents of all of which are incorporated herein by reference, in their entirety.

TECHNICAL FIELD

The present invention relates to an image-capturing device, an organic EL element, an image-capturing method, a program, and a recording medium.

BACKGROUND ART

Image-capturing devices using image-capturing elements and light emitting elements are used in various apparatuses such as digital cameras, cellular phones, and the like, for example.

Examples of the image-capturing device include a device in which a light emitting diode (LED) element is placed close to a lens and a device which allows illumination light to be entered through an external optical fiber over a lens. However, the optical systems of these devices are complicated, thereby increasing the sizes of the devices and costs as systems.

On the other hand, there is an image-capturing device using an organic EL element as a light emitting element (Patent Document 1).

CITATION LIST

Patent Document(s)

Patent Document 1: JP 2003-087502 A

BRIEF SUMMARY OF THE INVENTION

Problem to be Solved by the Invention

The use of an organic EL element or the like which is a thin light emitting element contributes to reduction in size of an image-capturing device and reduction of costs.

However, a light emitting element such as a transparent organic EL element emits light not only in the direction of a subject but also in the opposite direction (i.e., in the direction of the image-capturing element). Thus, in addition to the light reflected from the subject, the light emitted from the light emitting element in the opposite direction (i.e., in the direction of the image-capturing element) enters into the image-capturing element directly. This direct incident light may become a noise and may decrease the contrast of an obtained image.

Hence, the present invention is intended to provide an image-capturing device, an organic EL element, an image-capturing method, a program, and a recording medium that reduce the effect of direct incident light on an image-capturing element and allow a high contrast image to be obtained.

Means for Solving Problem

In order to achieve the above object, the present invention provides an image-capturing device including: an image-capturing element; a light emitting element; and an image data correction unit, wherein the light emitting element irradiates a subject with light, the image-capturing element senses the light reflected by the subject and generates an image data, and the image data correction unit corrects the image data by subtracting incident light directly entered into the image-capturing element from the light emitting element without being reflected by the subject from the image data.

The present invention also provides an organic EL element used as the light emitting element in the image-capturing device according to the present invention.

The present invention also provides an image-capturing method including steps of: irradiating a subject with light; sensing the light reflected by the subject with an image-capturing element, thereby generating image data; and correcting the image data by subtracting incident light directly entered into the image-capturing element without being reflected by the subject from the image data.

The present invention also provides a program that can execute the image-capturing method according to the present invention on a computer.

The present invention also provides a computer-readable recording medium recorded with the program according to the present invention.

Effects of the Invention

According to the image-capturing device, the organic EL element, the image-capturing method, the program, and the recording medium of the present invention, it is possible to reduce the effect of direct incident light on an image-capturing element and to obtain a high contrast image.

BRIEF DESCRIPTION OF DRAWINGS

FIG. 2A is a plan view and FIGS. 2B and 2C are cross sectional views.

MODE FOR CARRYING OUT THE INVENTION

Hereinafter, the present invention will be described in detail with reference to examples. The present invention, however, is not limited by the following description. In FIG. 1 and FIGS. 2A to 2C, identical components are indicated with identical numerals and symbols, and the descriptions for the identical components may be appropriately omitted. Furthermore, for convenience in explanation, the structure of each component shown in FIG. 1 and FIGS. 2A to 2C may be appropriately simplified, and the size, the ratio, and the like of components may be schematically shown and different from actual ones.

Embodiment 1

Figure 1:
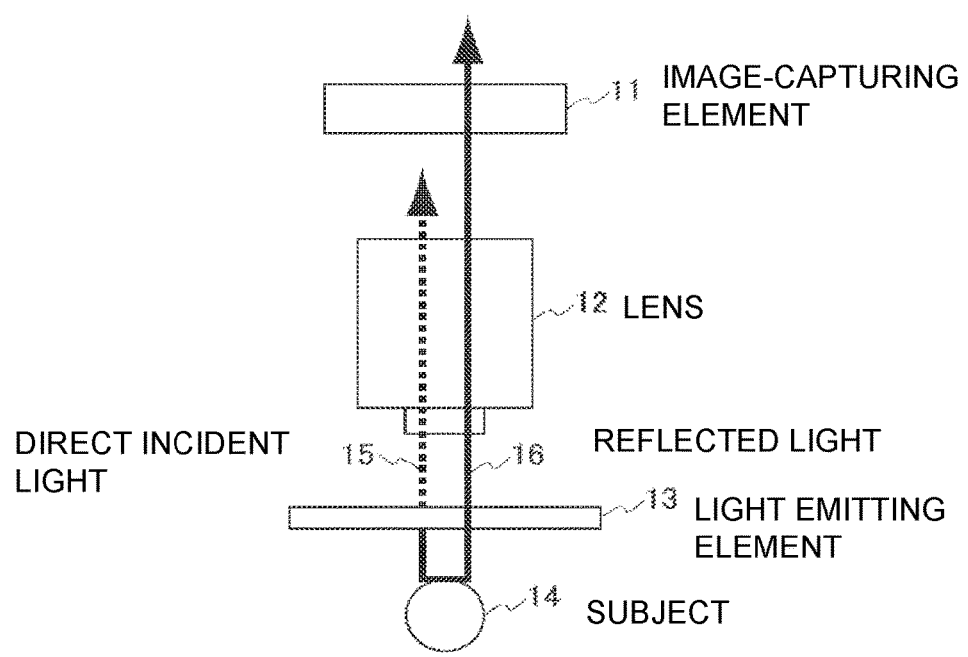
FIG. 1 is a schematic view showing an example of the configuration of the image-capturing device according to the present invention.

FIG. 1 is a schematic view showing an example of the configuration of the image-capturing device according to the present invention. As shown in FIG. 1, this image-capturing device includes an image-capturing element 11, a lens 12, and a light emitting element 13. The lens 12 is interposed between the image-capturing element 11 and the light emitting element 13. Thereby, incident light entered into the lens 12 from the light emitting element 13 side can be entered into the image-capturing element 11 through the lens 12.

The image-capturing device shown in FIG. 1 captures an image, for example, as follows. That is, first, the light emitting element 13 irradiates a subject 14 with light. The light is reflected by the subject 14. The reflected light 16 passes through the light emitting element 13, enters into the lens 12, passes through the lens 12, and enters into the image-capturing element 11. At this time, the light emitting element 13 also irradiates the opposite side of the subject 14 (i.e., the side where the lens 12 and the image-capturing element 11 are present) with light. This light (direct incident light) 15 is not reflected by the subject 14 but directly enters into the lens 12, passes through the lens 12, and enters into the image-capturing element 11.

The image-capturing element 11 senses the incident light and generates an image data. At this time, an image data correction unit (not shown) corrects the image data by subtracting (canceling) the direct incident light 15 from the image data using software (program). The image data after this correction is an image to be outputted. This correction reduces the effect of the direct incident light 15 on the image data and allows a high contrast image to be obtained.

There is no particular limitation on the image-capturing element 11, and examples thereof include image-capturing elements such as CCD, CMOS, and the like.

The lens 12 is not limited to a particular item as long as it has a function as a lens. In the image-capturing element according to the present invention, from the viewpoint of light utilization efficiency and the like, it is preferable to use a lens as the image-capturing device shown in FIG. 1, for example.

In the image-capturing device according to the present invention, there is no particular limitation on the placement of an image-capturing element, a lens, and a light emitting element. Preferably, the lens 12 and the light emitting element 13 are placed at the same side (same direction) viewed from the image-capturing element 11 as shown in FIG. 1, for example. This allows easier illumination (light irradiation) of an illumination-hardly-reachable area such as the bottom of a tube or the like, for example. Commonly, when an image is captured in the state where the distance between a lens and a subject is very close (e.g., closeup mode of digital camera), ambient light cannot be obtained sufficiently, and it is difficult to obtain a sharp image except for the case where the subject is a self-light emitting subject. The present invention solves the above-described problem by using a thin transparent organic EL light source as the light emitting element 13 (light source) and capturing an image of the subject 14 over the transparent organic EL light source, for example.

The correction method of the image data is not limited to a particular method. For example, the correction can be carried out by preliminarily measuring the light emission characteristics of the light emitting element to the image-capturing element side (lens side) and cancelling the value (i.e., subtracting the value from the image data) using software program.

Specifically, the scheme for cancelling the direct irradiation light which becomes a noise of the image data can be performed, for example, by the following steps (1) to (4).
(1) First, a microscope is used as an image-capturing element, and a black plate that hardly reflects light (ideally, reflectance is 0) is placed on a stage as a reference. This reference as a subject is irradiated with light by the light emitting element of the image-capturing device according to the present invention, and an image of the reference is captured.
(2) According to the step (1), because the black plate, which is a subject (reference), hardly reflects light, the light reflected by the subject can be regarded as 0. That is, only the light (direct incident light) directly entered into the image-capturing element from the light emitting element can be measured.
(3) The amount of light obtained by the measurement is stored in software (program) as the amount of direct incident light.
(4) In actual image-capturing, the image data is corrected by cancelling the amount of the direct incident light stored in the step (3) (i.e., subtracting the value from the image data).

In the steps (1) to (4), when the intensity (brightness) of the light emitted from the light emitting element is changed, the amount of direct incident light to the image-capturing element (microscope) side is increased. Thus, in the steps of (1) to (3), it is preferable to measure some samples of the amount of direct incident light by changing the intensity (brightness) of the light and store them according to need.

Figure 2A:
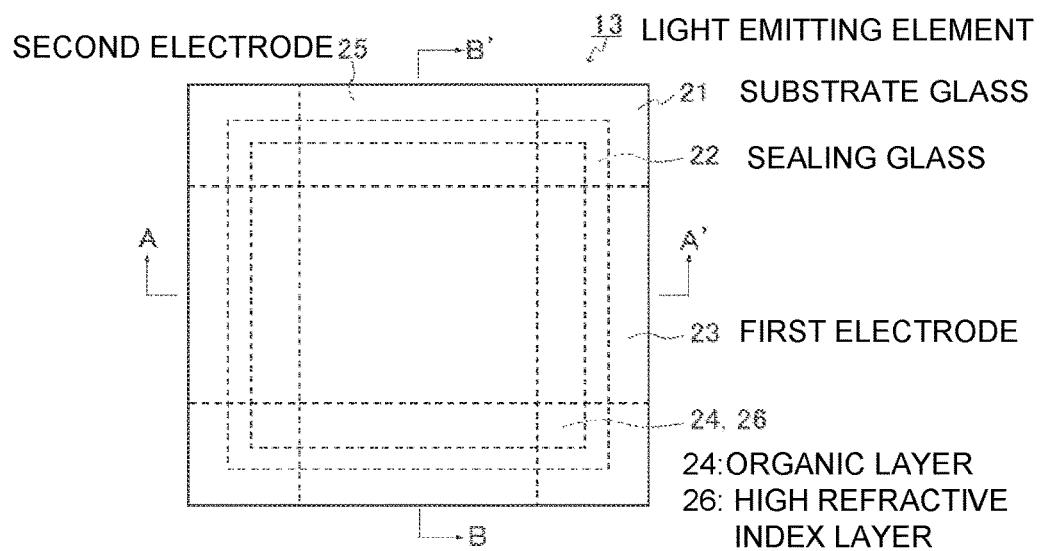
FIGS. 2A to 2C are schematic views each showing an example of the configuration of the light emitting element (organic EL element) used in the image-capturing device according to the present invention.
Figure 2B:
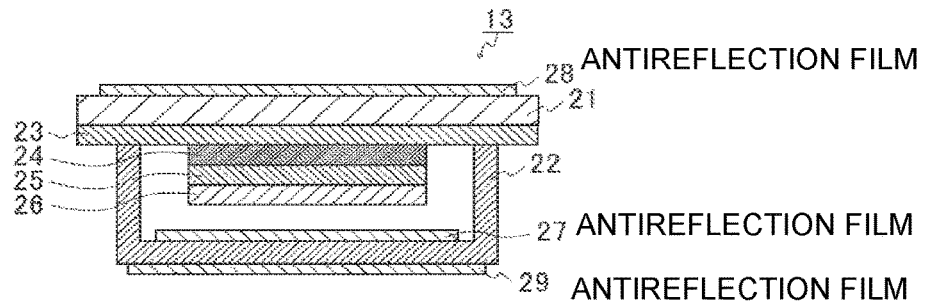
Figure 2C:
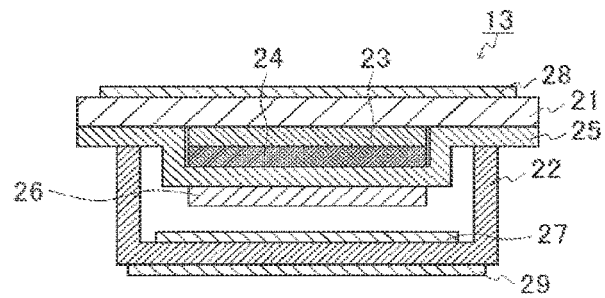

In the image-capturing element according to the present invention, the light emitting element is preferably an organic EL element. Furthermore, preferably, the organic EL element is designed such that the amount of light emitting to the subject side is larger than that emitting to the opposite side of the subject. The configuration of the organic EL element can be, for example, the following configuration A or the following configuration B. It is to be noted that "ITO" denotes indium tin oxide. In both of the following configurations A and B, preferably, the subject is placed at the substrate glass side and the subject is irradiated with the light emitted to the substrate glass side.
[Configuration A]
substrate glass/transparent electrode (ITO or the like)/organic layer/mirror electrode (Al or the like)/air/sealing glass
[Configuration B]
substrate glass/transparent electrode (ITO or the like)/organic layer/transparent electrode (ITO or the like)/air/sealing glass Each of FIGS. 2A to 2C specifically shows an example of the configuration of the organic EL element used in the image-capturing element according to the present invention. FIG. 2A is a plan view. FIG. 2B is a cross sectional view taken along line A-A' in FIG. 2A. FIG. 2C is a cross sectional view taken along line B-B' in FIG. 2A. As shown in FIGS. 2A to 2C, this organic EL element 13 includes a substrate glass 21, a sealing glass 22, a first electrode 23, an organic layer 24, a second electrode 25, a high refractive index layer 26, and antireflection films 27 to 29. On one surface of the substrate glass 21, the sealing glass 22, the first electrode 23, the organic layer 24, the second electrode 25, and the high refractive index layer 26 are tacked in this order. The organic layer 24 is interposed between the first electrode 23 and the second electrode 25 and is electrically connected to both of the electrodes. The side of the substrate glass 21 on which the first electrode 23, the organic layer 24, the second electrode 25, and the high refractive index layer 26 are stacked is covered with the sealing glass 22. The first electrode 23, the organic layer 24, the second electrode 25, and the high refractive index layer 26 are sealed in a space sandwiched between the substrate glass 21 and the sealing glass 22. In this space, an antireflection film 27 is placed in such a manner that it is in contact with the sealing glass 22 and faces the high refractive index layer 26. The both ends of each of the first electrode 23 and the second electrode 25 protrude to the outside of the sealing glass 22, and the first electrode 23 and the second electrode 25 can be electrically connected to external wirings and the like with the protruded parts. The first electrode 23 is not directly in contact with the second electrode 25, and the longitudinal direction (i.e., the direction in which the both ends protrude from the sealing glass 22) of the first electrode 23 is orthogonal to the longitudinal direction of the second electrode 25. The antireflection film 28 is placed on the side of the substrate glass 21 opposite to the side on which the first electrode 23, the organic layer 24, the second electrode 25, and the high refractive index layer 26 are stacked. The antireflection film 29 is placed on the side of the sealing glass 22 opposite to the side on which the antireflection film 27 is placed (i.e., on the outer side of the sealing glass 22). It is to be noted that, in the plan view of FIG. 2A, for simplification of illustration, the antireflection films 27 to 29 are not shown. The organic EL element 13 shown FIGS. 2A to 2C captures an image by placing the subject at the substrate glass 21 side and reflecting the light emitted to the substrate glass 21 side by the subject.

The first electrode 23 may be, for example, a transparent electrode or the like. The second electrode 25 may be a mirror electrode (Al or the like), or, for example, a transparent electrode or the like. The material for the transparent electrode is not limited to a particular material, and examples thereof include transparent conductive thin films formed of ITO, ZnO, IZO (registered trademark, indium-zinc oxide), IGZO (indium-gallium-zinc oxide), GZO (gallium-zinc oxide), $SnO_2$, and the like. Furthermore, either the first electrode 23 or the second electrode 25 may be an anode, and either the first electrode 23 or the second electrode 25 may be a cathode.

The organic layer 24 is not particularly limited as long as it includes a light-emitting layer. For example, the organic layer 24 may be the same as an organic layer in a common organic EL element. The organic layer 24 may include a light-emitting layer including an organic electroluminescence substance, may include a hole transport layer and an electron transport layer that sandwich the light-emitting layer, and may include a hole injection layer, an electron injection layer, and the like that sandwich the hole transport layer and the electron transport layer, for example. Furthermore, the organic layer 24 may further include a carrier-blocking layer that blocks a hole or an electron and increases the luminous efficiency, for example. The organic layer 24 may be a laminate in which the hole injection layer, the hole transport layer, the light-emitting layer, the electron transport layer, and the electron injection layer are stacked in this order from the first electrode 23 side, for example.

The hole injection layer is provided so as to lower the level of an injection barrier to a hole injected from the first electrode 23 to the organic layer 24 and to ease the difference in the energy level between the anode and the hole transport layer to allow the easy injection of a hole injected from the anode to the hole transport layer. The hole injection layer is formed of a hole injection layer material. Examples of the hole injection layer material include hole injection organic materials. Specific examples thereof include copper phthalocyanine and arylamine derivatives such as starburst type aromatic amine and the like. The hole injection organic material may be a material chemically doped with an inorganic matter such as vanadium pentoxide, molybdenum trioxide, or the like or an organic matter such as F4-TCNQ or the like for further lowering the level of the injection barrier and the drive voltage, for example.

The hole transport layer is preferably formed of a hole transport layer material. The hole transport layer material has a right amount of ionization potential for increasing the hole mobility to the light-emitting layer and, at the same time, has an electron affinity for preventing the leak of an electron from the light-emitting layer. Specific examples of the hole transport layer material include triphenyldiamines and starburst type aromatic amine. Examples of the triphenyldiamines include bis(di(p-tolyl)aminophenyl)-1,1-cyclohexane, 4,4'-bis(m-tolylphenylamino)biphenyl (TPD), and N,N'-diphenyl-N—N-bis(1-naphthyl)-1,1'-biphenyl)-4,4'-diamine (α-NPD).

The light-emitting layer recombines electrons and holes injected from electrodes to emit fluorescence, phosphorescence, or the like. The light-emitting layer contains a light-emitting material. Examples of the light-emitting material include low-molecular compounds such as tris(8-quinolinol) aluminum complex ($Alq_3$), bis diphenyl vinyl biphenyl (BDPVBi), 1,3-bis(p-t-butylphenyl-1,3,4-oxadiazolyl)phenyl (OXD-7), N,N'-bis(2,5-di-t-butylphenyl)perylene tetracarboxylic diimide (BPPC), 1,4bis(N-p-tolyl-N-4-(4-methyl styryl)phenylamino)naphthalene, and the like; and high-molecular compounds such as a polyphenylene vinylene polymer and the like.

Furthermore, for example, the light-emitting material is formed of a two-component system of a host and a dopant and may be a material in which excited-state energy generated in a host molecule is transferred to a dopant molecule to cause the dopant molecule to emit light. Examples of such a light-emitting material include the above-described light-emitting materials, the electron transport layer materials that will be described below, and the above-described hole transport layer materials. Specific examples thereof include materials obtained by doping hosts with dopants according to the following combinations:

Host: a quinolinol metal complex such as $Alq_3$ or the like
Dopant: a quinacridone derivative such as 4-dicyanomethylene-2-methyl-6-(p-dimethylaminostyryl)-4H-pyran (DCM), 2,3-quinacridone, or the like or a coumarin derivative such as 3-(2'-benzothiazole)-7-diethylaminocoumarin or the like;
Host: an electron transport material bis(2-methyl-8-hydroxyquinoline)-4-phenylphenol-aluminum complex
Dopant: a condensed polycyclic aromatic compound such as perylene or the like;
Host: a hole transport layer material 4,4'-bis(m-tolylphenylamino)biphenyl (TPD)
Dopant: rubrene or the like; and
Host: a carbazole compound such as 4,4'-biscarbazolylbiphenyl (CBP), 4,4'-bis(9-carbazolyl)-2,2'-dimethylbiphenyl (CDBP), or the like
Dopant: a platinum complex or an iridium complex such as tris-(2 phenylpyridine)iridium ($Ir(ppy)_3$), bis(4,6-di-fluorophenyl)-pyridinate-N,C2)iridium(picolinate) (FIr(pic)), bis(2-2'-benzothienyl)-pyridinate-N,C3iridium(acetylacetonate) ($Btp_2Ir(acac)$), tris-(picolinate)iridium ($Ir(pic)_3$), bis(2-phenylbenzothiozolate-N,C2)iridium(acetylacetonate) ($Bt_2Ir(acac)$), or the like.

The light-emitting material can be selected appropriately according to a desired color of the light to be emitted from an organic EL lighting panel, for example. Specific examples of the selection are as follows:

in the case of green light emission:
Host: $Alg_3$
Dopant: quinacridone, coumarin, or the like or
Host: CBP
Dopant: $Ir(ppy)_3$ or the like;
in the case of blue light emission:
Host: 4,4'-bis(2,2-diphenylethenyl)-1,1'-biphenyl (DPVBi)
Dopant: perylene, a distyrylallylene derivative or the like or
Host: CBP
Dopant: FIr(pic) or the like;
in the case of green to blue-green light emission:
Host: $Alg_3$
Dopant: OXD-7 or the like;
in the case of red to orange light emission:
Host: $Alg_3$
Dopant: DCM or 4-(dicyanomethylene)-2-t-butyl-6-(1,1,7,7-tetramethyljulolidyl-9-enyl)-4H-pyran (DCJTB) or
Host: CBP
Dopant: $Ir(pic)_3$ or the like; and
in the case of yellow light emission:
Host: $Alg_3$
Dopant: rubrene or
Host: CBP
Dopant: $Bt_2Ir(acac)$ or the like.

The light-emitting layer of emitting white light can be, for example, a three-layered layer that contains light-emitting materials of emitting red, green, and blue. In addition to this, examples of the light-emitting layer of emitting white light include a two-layered layer that contains light-emitting materials of emitting complementary colors such as blue and yellow, and the like and a single-layered layer obtained using the light-emitting materials of the respective colors by multiple co-evaporation or the like so that the light-emitting materials of the respective colors are mixed. Furthermore, a layer obtained by planarly aligning, in order, fine pixels of red, blue, green, and the like of the light-emitting materials that form the respective color layers of the three-layered layer and the two-layered layer may be used as the light-emitting layer of emitting white light.

The electron transport layer is preferably formed of an electron transport layer material. The electron transport layer material has a right amount of ionization potential for increasing the electron mobility to the light-emitting layer and, at the same time, has an electron affinity for preventing the leak of a hole from the light-emitting layer. Specific examples of the electron transport layer material include organic materials such as oxadiazole derivatives such as 2-(4-biphenylyl)-5-(4-t-butylphenyl)-1,3,4-oxadiazole (Bu-PBD), OXD-7, and the like; triazole derivatives; quinolinol metal complexes; and the like. Furthermore, the electron transport layer material may be a material obtained by causing organic material to be chemically doped with an electron-donating substance such as an alkali metal such as lithium or the like, for example.

The electron injection layer is provided to ease the difficulty in electron injection from the cathode to the electron transport layer due to a great difference in energy between the work function of a metal material such as aluminum or the like used for forming a cathode and the electron affinity (LUMO level) of the electron transport layer, for example. The electron injection layer is preferably formed of an electron injection layer material. An example of the electron injection layer material includes a material with a low work function, and specific examples thereof include fluorides and oxides of alkali metals such as lithium, cesium, and the like and alkali earth metals such as calcium and the like; magnesium-silver; and lithium aluminum alloy.

An example of the carrier-blocking layer includes a hole-blocking layer. The hole-blocking layer is provided between the light-emitting layer and the electron transport layer for blocking a hole passing through the light-emitting layer without involving in light emission and increasing the recombination probability in the light-emitting layer. Examples of the materials for forming the hole-blocking layer include 2,9-dimethyl-4,7-diphenyl-1,10-phenanthroline (BCP), triphenyldiamine derivatives, and triazole derivatives.

There is no particular limitation on the thickness of the organic layer 24. The thickness of each of the layers that form the organic layer 24 is, for example, in the range from 1 to 500 nm, and the total thickness of the layers is, for example, in the range from 100 to 1000 nm.

The material for the high refractive index layer 26 is not limited to a particular material, and the material can be, for example, titanium dioxide having a higher refractive index than ITO.

The material for the antireflection films 27 to 29 is not limited to a particular material, and the material can be, for example, a laminated structure of one of or two or more of materials such as $MgF_2$ (magnesium fluoride, refractive index: 1.37), tantalum pentoxide, silicon dioxide, and the like.

In the organic EL element used in the image-capturing device according to the present invention, for increasing the amount of light emitting to the subject side, for example, the following method (configuration of organic EL element) can be employed. That is, first, difference of the refractive index is about 0.8 at the interface between the transparent electrode at the sealing glass side and gas such as air or at the interface between the transparent electrode and a vacuum, for example. Thus, due to the Fresnel reflection, the amount of light emitted to the substrate glass side is increased relatively. For using this phenomenon positively, the organic EL element is preferably sealed in a space. Specifically, for example, the organic EL element may be sealed by a hollow glass. More specifically, for example, as shown in FIGS. 2A to 2C, the organic EL element is preferably sealed in a space sandwiched between a substrate glass and a sealing glass. Furthermore, there is no particular limitation on the atmosphere in the space in which the organic EL element is sealed (gas surrounding the organic EL element sealed in the space), and the atmosphere can be, for example, air, inert gas (nitrogen gas, argon gas, or the like), or the like or can be a vacuum. From the viewpoint of preventing the organic EL element from being deteriorated, the water content in the atmosphere is preferably as little as possible. Furthermore, from the same point of view, the oxygen content in the atmosphere is preferably as little as possible. Particularly preferably, the atmosphere does not contain oxygen (for example, the atmosphere is the inert gas). For promoting this phenomenon, for example, the high refractive index layer having a higher refractive index may be stacked on the transparent electrode. Furthermore, by appropriately designing the thickness of each of the transparent electrode, the organic layer, and other layers so as to optimize an interference condition, the amount of light emitted to both sides of the organic EL element may be biased to one of the sides.

In addition, in the organic EL element, for increasing the amount of light emitting to the subject side, for example, an object which casts a shadow (e.g., mesh auxiliary wiring) is preferably not placed on the light emitting side of the organic EL element. Preferably, the haze value of the organic EL element, which is an indicator of the cloudiness, is 10% or less. It is to be noted that the haze value can be measured according to JIS-K-7136, for example. It is to be noted that this measurement method is merely illustrative and does not limit the present invention. Furthermore, in the organic EL element, the transmittance of light emitted from the organic EL element itself is preferably 90% or more. Moreover, for suppressing the reflection at the substrate glass and sealing glass, the antireflection film may be used as described above. In addition to or in place of the antireflection film, a moth-eye sheet or the like may be used.

The configurations of the organic EL element used in the image-capturing device according to the present invention are not limited to those described above, and various changes can be made. For example, the organic EL element may include components other than those shown in FIG. 2. For example, components except for the first electrode 23, the organic layer 24, and the second electrode 25 shown in FIG. 2 may appropriately be omitted or placed differently.

The use of the image-capturing device according to the present invention is not limited to a particular use and can be used, for example, in cameras, microscopes, scanners, and the like. While the image-capturing device according to the present invention can be used in an apparatus which needs scanning such as a copier, it is appropriate to an optical system which requires to capture an image at once. The optical system which requires to capture an image at once is, for example, a light source for a microscope that captures an image of a relatively small region. In particular, in the case of using a lens having a short focal distance, while sufficient illumination (amount of light) cannot be obtained in general, a large amount of light can be obtained according to the image-capturing device according to the present invention. Thus the image-capturing device according to the present invention is effective in such a case. Also in the case of observing the inside of a tube, because the image-capturing device according to the present invention can illuminate the bottom vertically, a large amount of light can be obtained. Thus the image-capturing device according to the present invention is effective in such a case.

In addition, the image-capturing device according to the present invention brings about the following effects (1) to (3), for example. However, these are merely illustrative and do not limit the present invention.

(1) As described above, a sharp image can be captured even in the case where obtainment of ambient light is difficult.
(2) An illumination system in an optical system can be simplified and it contributes to cost-cutting.
(3) It allows a thinner optical system and it contributes to downsizing of a device. In these years, as mobile devices become smaller, there is a demand for simpler, smaller, and thinner optical systems. The image-capturing device according to the present invention can satisfy this request.

The invention of the present application was described above with reference to the embodiments. However, the invention of the present application is not limited to the above-described embodiments. Various changes that can be understood by those skilled in the art can be made in the configurations and details of the invention of the present application within the scope of the invention of the present application.

A part or the whole of the above-described embodiments can be described as the following supplementary notes. The present invention, however, is not limited by the following supplementary notes.

(Supplementary Note 1)
The invention of supplementary note 1 provides an image-capturing device including: an image-capturing element; a light emitting element; and an image data correction unit, wherein the light emitting element irradiates a subject with light, the image-capturing element senses the light reflected by the subject and generates an image data, and the image data correction unit corrects the image data by subtracting incident light directly entered into the image-capturing element from the light emitting element without being reflected by the subject from the image data.

(Supplementary Note 2)
The invention of supplementary note 2 provides the image-capturing device according to supplementary note 1, wherein the light emitting element is an organic electroluminescence (EL) element.

(Supplementary Note 3)
The invention of supplementary note 3 provides the image-capturing device according to supplementary note 1 or 2, wherein the image-capturing element is a charge coupled device (CCD) or a complementary MOS (CMOS) image sensor.

(Supplementary Note 4)
The invention of supplementary note 4 provides the image-capturing device according to any one of supplementary notes 1 to 3, wherein the light reflected by the subject passes through the light emitting element and enters into the image-capturing element.

(Supplementary Note 5)
The invention of supplementary note 5 provides the image-capturing device according to any one of supplementary notes 1 to 4 further including a lens, wherein the light reflected by the subject passes through the lens and enters into the image-capturing element.

(Supplementary Note 6)
The invention of supplementary note 6 provides an organic EL element used as the light emitting element according to any one of supplementary notes 1 to 4

(Supplementary Note 7)
The invention of supplementary note 7 provides the organic EL element according to supplementary note 6, including a first electrode, an organic layer including a light-emitting layer, and a second electrode, wherein the first electrode, the organic layer, and the second electrode are stacked in this order, and the organic layer is electrically connected to both of the electrodes.

(Supplementary Note 8)
The invention of supplementary note 8 provides the organic EL element according to supplementary note 7, wherein both of the first electrode and the second electrode are transparent electrodes.

(Supplementary Note 9)
The invention of supplementary note 9 provides the organic EL element according to supplementary note 7 or 8, wherein all of the first electrode, the organic layer, and the second electrode are sealed in a space.

(Supplementary Note 10)
The invention of supplementary note 10 provides the organic EL element according to any one of supplementary notes 7 to 9, further including a substrate glass and a sealing glass, wherein all of the first electrode, the organic layer, and the second electrode are sealed in a space sandwiched between the substrate glass and the sealing glass.

(Supplementary Note 11)
The invention of supplementary note 11 provides the organic EL element according to any one of supplementary notes 7 to 10 further including a high refractive index layer, wherein the high refractive index layer is interposed between the first electrode, the organic layer, and the second electrode and the image-capturing element.

(Supplementary Note 12)

The invention of supplementary note 12 provides the organic EL element according to supplementary note 11, wherein the high refractive index layer is formed of titanium dioxide.

(Supplementary Note 13)

The invention of supplementary note 13 provides the organic EL element according to any one of supplementary notes 7 to 12, wherein the haze value is 10% or less.

(Supplementary Note 14)

The invention of supplementary note 14 provides the organic EL element according to any one of supplementary notes 7 to 13, wherein the transmittance of the light emitted from the organic EL element itself is 90% or more.

(Supplementary Note 15)

The invention of supplementary note 15 provides an image-capturing method including steps of: irradiating a subject with light; sensing the light reflected by the subject with an image-capturing element, thereby generating image data; and correcting the image data by subtracting incident light directly entered into the image-capturing element without being reflected by the subject from the image data.

(Supplementary Note 16)

The invention of supplementary note 16 provides the image-capturing method according to supplementary note 15 carried out using the image-capturing device according to any one of supplementary notes 1 to 5.

(Supplementary Note 17)

The invention of supplementary note 17 provides a program that can execute the image-capturing method according to supplementary note 15 or 16 on a computer.

(Supplementary Note 18)

The invention of supplementary note 18 provides the program according to supplementary note 17 for making the image-capturing device according to any one of supplementary notes 1 to 5 execute the image-capturing method according to supplementary note 16.

(Supplementary Note 19)

The invention of supplementary note 19 provides a computer-readable recording medium recorded with the program according to supplementary note 17 or 18.

This application claims priority from: Japanese Patent Application No. 2013-232165 filed on Nov. 8, 2013. The entire disclosure of this Japanese Patent Application is incorporated herein by reference.

EXPLANATION OF REFERENCE NUMERALS 11 image-capturing element
12 lens
13 light emitting element
14 subject
16 light reflected by subject 14
15 direct incident light
21 substrate glass
22 sealing glass
23 first electrode
24 organic layer
25 second electrode
26 high refractive index layer
27, 28, 29 antireflection film

What is claimed is:

1. An image-capturing device comprising:
   an image-capturing sensor;
   a light emitting source; and
   an image data correction unit, implemented by a processor, wherein the light emitting source irradiates a subject with light,
   the image-capturing sensor senses the light reflected by the subject and generates an image data,
   the image data correction unit corrects the image data by subtracting, from the image data, incident light directly entered into the image-capturing sensor from the light emitting source without being reflected by the subject,
   the image data correction unit obtains a light emission characteristic by placing a black body reference subject at the position of the subject and performing a preliminary measurement of the light emission characteristic of light that is emitted from the light emitting source and directly entered into the image-capturing sensor using the black body reference subject, and
   the image data correction unit corrects the image data by performing subtraction based on the light emission characteristic that is obtained by the preliminary measurement.

2. The image-capturing device according to claim 1, wherein the light emitting source is an organic electroluminescence (EL) element.

3. The image-capturing device according to claim 1, wherein the image-capturing sensor is a charge coupled device (CCD) or a complementary MOS (CMOS) image sensor.

4. The image-capturing device according to claim 1, wherein the light reflected by the subject passes through the light emitting source and enters into the image-capturing sensor.

5. An organic electroluminescence (EL) element used as the light emitting source according to claim 1.

6. The organic EL element according to claim 5, comprising
   a first electrode,
   an organic layer comprising a light-emitting layer, and
   a second electrode, wherein
   the first electrode, the organic layer, and the second electrode are stacked in this order, and the organic layer is electrically connected to both of the first and second electrodes.

7. The organic EL element according to claim 6, wherein both of the first electrode and the second electrode are transparent electrodes.

8. An image-capturing method comprising steps of:
   irradiating, by a light emitting source, a subject with light;
   sensing the light reflected by the subject with an image-capturing sensor, thereby generating image data; and
   correcting, by an image data correction unit implemented by a processor, the image data by subtracting, from the image data, incident light directly entered into the image-capturing sensor without being reflected by the subject, wherein
   the image data correction unit obtains a light emission characteristic by placing a black body reference subject at the position of the subject and performing a preliminary measurement of the light emission characteristic of light that is emitted from the light emitting source and directly entered into the image-capturing sensor using the black body reference subject, and
   the image data correction unit corrects the image data by performing subtraction based on the light emission characteristic that is obtained by the preliminary measurement.

9. A non-transitory computer-readable recording medium recorded with a program, which, when executed by a computer, performs the method according to claim 8.

\* \* \* \* \*